United States Patent
Hong

(10) Patent No.: US 9,654,712 B2
(45) Date of Patent: May 16, 2017

(54) PIXELS WITH A GLOBAL SHUTTER AND HIGH DYNAMIC RANGE

(71) Applicant: SEMICONDUCTOR COMPONENTS INDUSTRIES, LLC, Phoenix, AZ (US)

(72) Inventor: Sungkwon C. Hong, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 20 days.

(21) Appl. No.: 14/877,722

(22) Filed: Oct. 7, 2015

(65) Prior Publication Data

US 2017/0104946 A1 Apr. 13, 2017

(51) Int. Cl.
| | |
|---|---|
| H04N 5/335 | (2011.01) |
| H04N 5/374 | (2011.01) |
| H04N 9/07 | (2006.01) |
| H04N 5/378 | (2011.01) |
| H01L 27/146 | (2006.01) |

(52) U.S. Cl.
CPC ......... *H04N 5/374* (2013.01); *H01L 27/1461* (2013.01); *H01L 27/14609* (2013.01); *H01L 27/14612* (2013.01); *H01L 27/14621* (2013.01); *H01L 27/14627* (2013.01); *H01L 27/14636* (2013.01); *H01L 27/14645* (2013.01); *H04N 5/378* (2013.01); *H04N 9/07* (2013.01)

(58) Field of Classification Search
CPC ............... G06T 5/006; H01L 27/14634; H01L 27/14636; H04N 5/345; H04N 5/369; H04N 5/378
See application file for complete search history.

(56) References Cited

U.S. PATENT DOCUMENTS

| | | | |
|---|---|---|---|
| 7,960,768 B2 | 6/2011 | Dungan et al. | |
| 8,368,157 B2 | 2/2013 | Lenchenkov | |
| 8,890,047 B2 * | 11/2014 | Solhusvik | H01L 27/14634 250/208.1 |
| 2004/0096124 A1 * | 5/2004 | Nakamura | H04N 5/35554 382/308 |
| 2007/0035649 A1 * | 2/2007 | McKee | H01L 27/14609 348/308 |
| 2008/0007638 A1 * | 1/2008 | Aoki | H04N 5/23245 348/294 |

(Continued)

OTHER PUBLICATIONS

Velichko et al., U.S. Appl. No. 14/836,599, filed Aug. 26, 2015.

*Primary Examiner* — Amy Hsu
(74) *Attorney, Agent, or Firm* — Treyz Law Group, P.C.; Joseph F. Guihan

(57) ABSTRACT

An imaging pixel may be provided with a photodiode and a floating diffusion region. The pixel may include at least one storage capacitor that can store charge from the floating diffusion region. The at least one storage capacitor may provide global shutter functionality for the pixel. Multiple storage capacitors may be provided for correlated double sampling (CDS) techniques and high dynamic range (HDR) images. The imaging pixel may have an upper substrate layer and a lower substrate layer. The photodiode may be formed in the upper substrate layer, and the storage capacitors may be formed in the lower substrate layer. A interconnect layer may couple pixel circuitry in the upper substrate layer to pixel circuitry in the lower substrate layer.

15 Claims, 9 Drawing Sheets

(56) References Cited

U.S. PATENT DOCUMENTS

| | | | |
|---|---|---|---|
| 2011/0019049 A1* | 1/2011 | Jin | H01L 27/14609 348/308 |
| 2012/0268566 A1* | 10/2012 | Kim | H04N 5/3696 348/46 |
| 2013/0016203 A1* | 1/2013 | Saylor | G06K 9/00604 348/78 |
| 2014/0078368 A1* | 3/2014 | Komori | H04N 5/3745 348/307 |

* cited by examiner

PIXELS WITH A GLOBAL SHUTTER AND HIGH DYNAMIC RANGE

BACKGROUND

This relates generally to imaging systems, and more particularly, to imaging systems with global shutter functionality.

Modern electronic devices such a cellular telephones, cameras, and computers often use digital image sensors. Imagers (i.e., image sensors) often include a two-dimensional array of image sensing pixels. Each pixel typically includes a photosensor such as a photodiode that receives incident photons (light) and converts the photons into electrical signals.

Conventional image sensors are fabricated on a semiconductor substrate using complementary metal-oxide-semiconductor (CMOS) technology or charge-coupled device (CCD) technology. In CMOS image sensors, a rolling shutter or a global shutter may be used. In a global shutter, every pixel in the image sensor may simultaneously capture an image, whereas in a rolling shutter each row of pixels may sequentially capture an image. In CMOS image sensors with a global shutter, a charge storage region is typically incorporated into each pixel to store charge from the photodiode until read out. However, these pixels may not be able to acquire high dynamic range (HDR) images, which limits the functionality of the image sensor. Additionally, these pixels may not be able to acquire images using correlated double sampling (CDS) techniques. This may increase noise in the pixels and decrease the image quality of the image sensor.

It would therefore be desirable to be able to provide improved CMOS image sensors with global shutter functionality.

DETAILED DESCRIPTION

Electronic devices such as digital cameras, computers, cellular telephones, and other electronic devices include image sensors that gather incoming image light to capture an image. The image sensors may include arrays of imaging pixels. The pixels in the image sensors may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
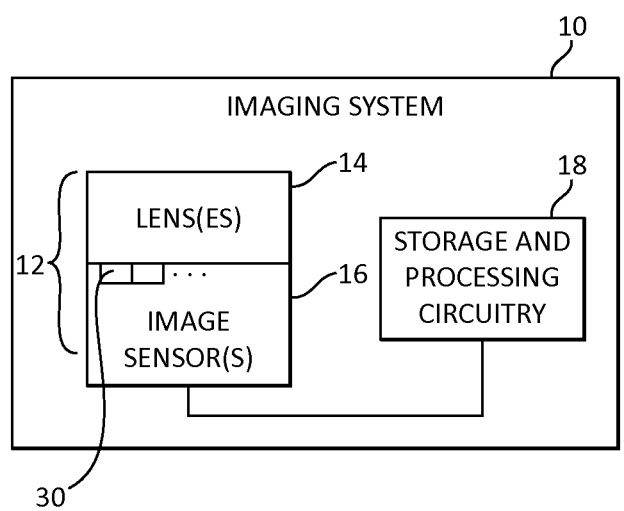
FIG. 1 is a diagram of an illustrative imaging system that may include an image sensor having image pixels with a global shutter in accordance with an embodiment of the present invention.

FIG. 1 is a diagram of an illustrative imaging system that uses an image sensor with a global shutter. Imaging system 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. Image sensor 16 may be an image sensor integrated circuit die with an array of image pixels 30. Image pixels 30 may each include a shutter element for controlling when charge is acquired on the image pixel.

During image capture operations, lens 14 may focus light from a scene onto an image pixel array in image sensor 16. Image sensor 16 may provide corresponding digital image data to control circuitry such as storage and processing circuitry 18.

Circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be further processed and/or stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Figure 2:
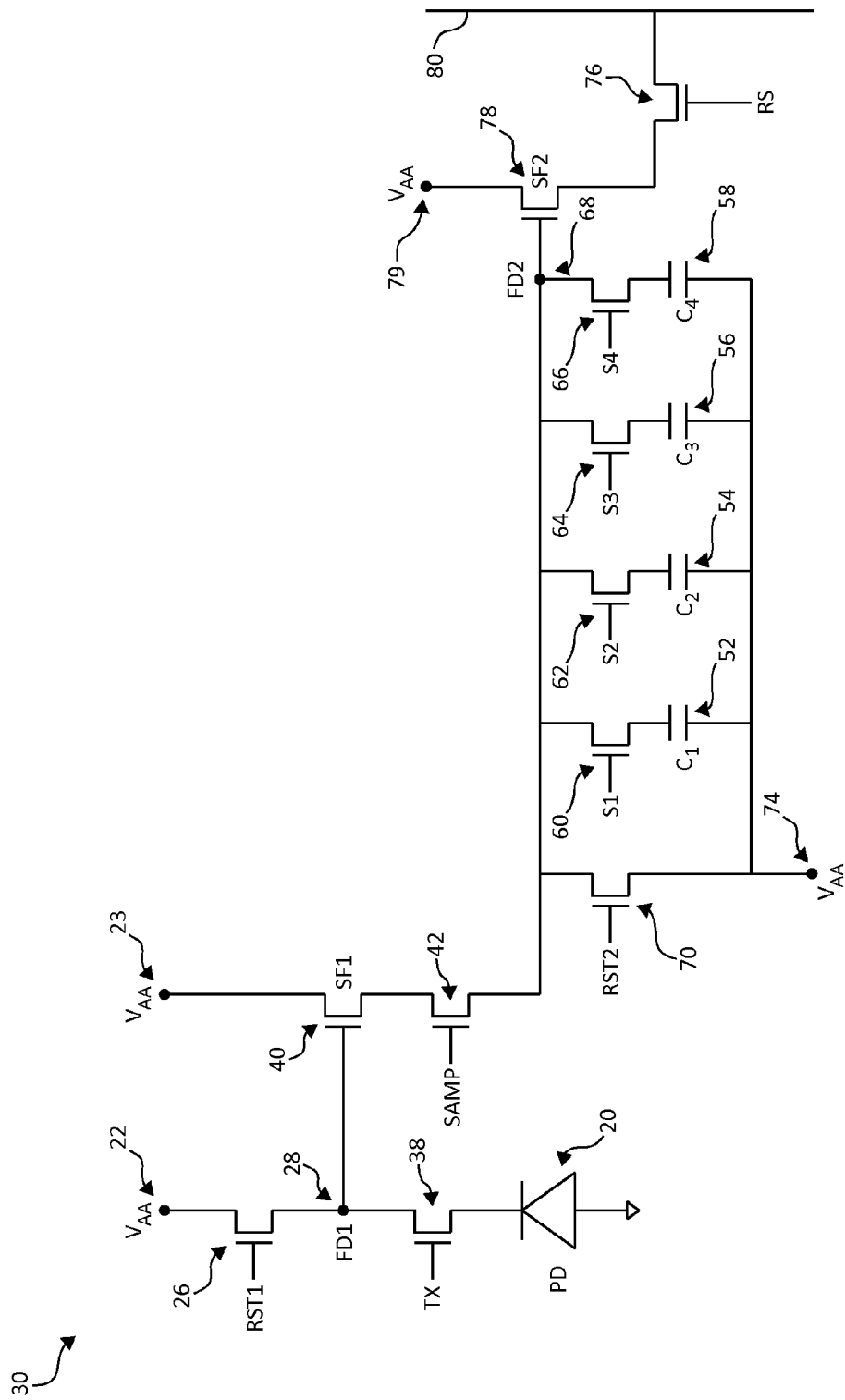
FIG. 2 is a diagram of an illustrative image pixel that uses at least one storage capacitor for a global shutter in accordance with an embodiment of the present invention.

FIG. 2 is a circuit diagram of an illustrative image pixel 30. As shown in FIG. 2, pixel 30 may include a photosensitive element such as photodiode 20. A positive power supply voltage Vaa may be supplied at positive power supply terminals 22 and 23. Incoming light may be collected by photodiode 20 after passing through a color filter structure. Photodiode 20 generates charge (e.g., electrons) in response to receiving impinging photons. The amount of charge that is collected by photodiode 20 depends on the intensity of the impinging light and the exposure duration (or integration time).

Pixel 30 may include a floating diffusion region and a reset transistor for resetting the charge at the floating diffusion region. Before an image is acquired, reset transistor 26 (RST1) may be turned on to reset charge storage node 28 (sometimes referred to as floating diffusion region FD1) to Vaa. Reset transistor 26 may be turned off after FD1 has been reset to allow charge to be stored in FD1.

Charge generated in photodiode 20 may be stored in charge storage region 28 (FD1). Pixel 30 may include a transfer gate (transistor) 38. Transfer transistor 38 (38) may be turned on to transfer charge from photodiode 20 to floating diffusion region 28. Floating diffusion region 28 may be a doped semiconductor region (e.g., a region in a silicon substrate that is doped by ion implantation, impurity diffusion, or other doping process).

Pixel 30 may also include a source-follower transistor 40 (SF1) that is coupled to power supply voltage Vaa at terminal 23. SF1 may also be coupled to sampling transistor 42 (SAMP).

Pixel 30 may include a number of capacitors, such as capacitors 52, 54, 56, and 58 (C1, C2, C3, and C4 respectively). Capacitors 52, 54, 56, and 58 may be used to store charge from FD1. Each capacitor may be associated with a respective transistor. For example, transistor 60 (S1) may be associated with storage capacitor 52, transistor 62 (S2) may be associated with storage capacitor 54, transistor 64 (S3) may be associated with storage capacitor 56, and transistor 66 (S4) may be associated with storage capacitor 58.

An additional floating diffusion region 68 (FD2) and reset transistor 70 (RST2) may be provided in pixel 30. Reset transistor 70 may be asserted to couple floating diffusion region 68 to power supply terminal 74, which may reset the charge at FD2. Floating diffusion region 68 may be a doped semiconductor region (e.g., a region in a silicon substrate that is doped by ion implantation, impurity diffusion, or other doping process).

Pixel 30 may also include charge readout circuitry. The charge readout circuitry may include row-select transistor 76 (RS) and source-follower transistor 78 (SF2). SF2 may be coupled to power supply terminal 79. Transistor 76 may have a gate that is controlled by a row select signal. When the row select signal is asserted, transistor 76 is turned on and a corresponding signal Vout (e.g., an output signal having a magnitude that is proportional to the amount of charge at floating diffusion node 68) is passed onto output path 80.

In a typical image pixel array configuration, there are numerous rows and columns of pixels 30. A column readout path such as output line 80 may be associated with each column of pixels 30 (e.g., each image pixel 30 in a column may be coupled to output line 80 through an associated row-select transistor 76). The row select signal may be asserted to read out signal Vout from a selected image pixel onto column readout path 80. Image data Vout may be fed to processing circuitry 18 for further processing. The circuitry of FIG. 2 is merely illustrative. If desired, pixel 30 may include other pixel circuitry.

For example, although not shown in FIG. 2, pixel 30 may include a pixel reset transistor that is coupled between photodiode 20 and a power supply terminal. This type of pixel reset transistor may reset photodiode 20 to the power supply voltage when turned on and allow the photodiode to accumulate photo-generated charge when turned off.

If desired, pixel 30 may also be provided with an additional transistor used to implement a dual conversion gain mode. In particular, pixel 30 may be operable in a high conversion gain mode and in a low conversion gain mode. If the additional transistor is disabled, pixel 30 will be placed in a high conversion gain mode. If the additional transistor is enabled, pixel 30 will be placed in a low conversion gain mode. The additional transistor may be coupled to a capacitor. When the additional transistor is turned on, the capacitor may be switched into use to provide floating diffusion FD with additional capacitance. This results in lower conversion gain for pixel 30. When the additional transistor is turned off, the additional loading of the capacitor is removed and the pixel reverts to a relatively higher pixel conversion gain configuration.

In FIG. 2, positive power supply terminals 22, 23, 74, and 79 are depicted as all being separate entities. It should be noted that this example is merely illustrative. If desired, one, two, three, or four power supply terminals may be provided. More than one line may be coupled to any or all power supply terminals in the pixel. The power supply terminals may each provide the same power supply voltage or may provide different power supply voltages if desired.

During operation of pixel 30, capacitors C1, C2, C3, and C4 may be used to store charge from floating diffusion 28. When sampling transistor 42 is asserted, charge from floating diffusion 28 may be stored in a storage capacitor. A storage capacitor may be selected to store charge from floating diffusion 28 by asserting the transistor that is associated with the desired storage capacitor. For example, S1 may be turned on while RST2, S2, S3, and S4 are all turned off. In this example, charge from FD1 may be stored in C1 when SAMP is turned on. In another example, S2 and SAMP may be turned on while RST2, S1, S3, and S4 are all turned off to store charge in C2. In yet another example, S3 and SAMP may be turned on while RST2, S1, S2, and S4 are all turned off to store charge in C3. Finally, S4 and SAMP may be turned on while RST2, S1, S2, and S3 are all turned off to store charge in C4. Using this scheme, various samples of charge from FD1 may be stored in pixel 30 at the same time. For example, samples may be stored in C1, C2, C3, and C4 simultaneously.

When read out of the charges stored in the storage capacitors is desired, the respective transistor (e.g., S1, S2, S3, or S4) and row select transistor 76 may be asserted. For example, RST2 may be briefly turned on to reset FD2. Subsequently, S1 and RS may be turned on. The charge from C1 may then be sampled from FD2 and output via output line 80. Similarly, asserting S2, S3, or S4 individually will sample the charge at C2, C3, or C4. Sampling transistor 42 may be turned off throughout the read out of the pixel.

The pixel arrangement shown in FIG. 2 offers many advantages. Charge from various samples may be stored in the storage capacitors. This may allow implementation of a global shutter. In a global shutter, every pixel in an image sensor accumulates charge simultaneously. For complementary metal-oxide semiconductor (CMOS) image sensors, the charge may then be stored in an intermediate charge storage region before being read out. In FIG. 2, multiple intermediate charge storage regions are provided. This may allow high dynamic range images (which require at least two samples with different integration times) to be obtained with a global shutter.

The arrangement of pixel 30 may also allow for correlated double sampling (CDS) to be implemented with a global shutter. When charge storage regions are reset (e.g., when FD1 and FD2 are reset by reset transistors RST1 and RST2), reset noise (sometimes referred to as kTC noise) may be present. To account for this noise, the charge at a floating diffusion region may be sampled after reset and before charge transfer from the photodiode. The charge at the floating diffusion region may be sampled again after charge transfer from the photodiode. The first sample value may be subtracted from the second sample value to determine how much charge was generated by the photodiode (by eliminating charge at the floating diffusion region that is unassociated with incident light). Because pixel 30 has multiple storage capacitors, correlated double sampling may be used. For example, the reset value may be stored on a first storage capacitor and the sample value may be stored on a second storage capacitor.

Figure 3:
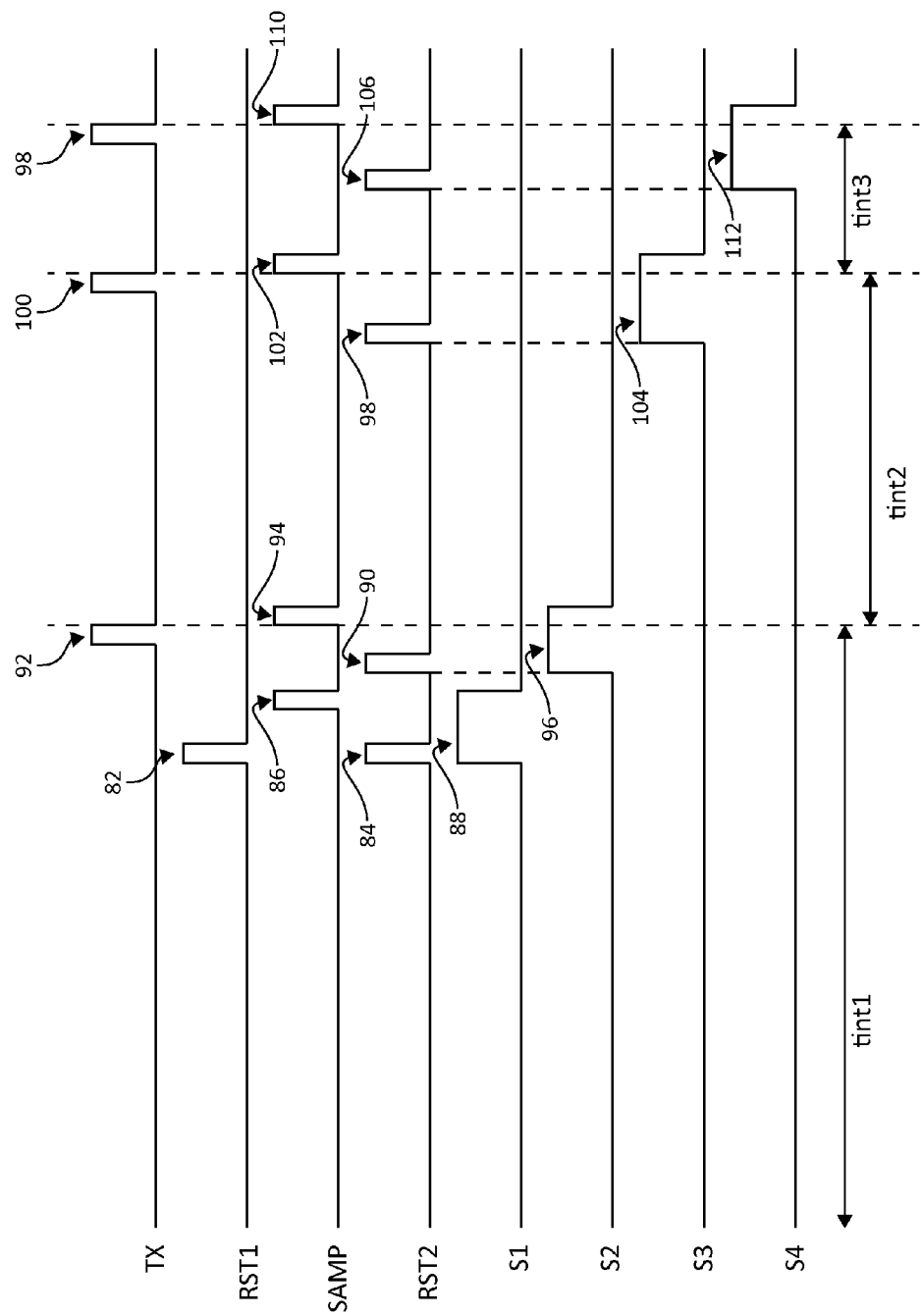
FIG. 3 is an illustrative timing diagram for collecting image samples with a pixel such as the pixel in FIG. 2 in accordance with an embodiment of the present invention.

An illustrative timing diagram for operation of pixel 30 in FIG. 2 is shown in FIG. 3. The timing diagram of FIG. 3 is merely an example, and it should be understood that a wide variety of other timing schemes may be used with pixel 30.

The timing diagram of FIG. 3 begins with a first integration time ($t_{int1}$). Photodiode 20 may accumulate photo-generated charge during $t_{int1}$, as well as during a second integration time ($t_{int2}$) and a third integration time ($t_{int3}$). Before sampling the charge from photodiode 20, FD1 and FD2 may be reset by turning on reset transistors RST1 and RST2 at assertions 82 and 84. This may couple FD1 and FD2 to power supply voltage terminals 22 and 74, respectively, and ensure that no excess charge is present in the floating diffusion regions. S1 may also be turned on at assertion 88.

After resetting FD1 and FD2, the reset level at FD1 may be sampled. To sample the reset level at FD1, sampling transistor SAMP may be asserted at assertion 86. Because RST2, S2, S3, and S4 are all turned off during assertions 86 and 88, the charge from FD1 will be stored in C1 when SAMP and S1 are asserted.

After storing the reset level in storage capacitor C1, reset transistor RST2 may be asserted at assertion 90. At the same time, S2 may be asserted at assertion 96. Next, the transfer transistor (TX) may be turned on at assertion 92. This will transfer charge from photodiode 20 to FD1. The end of assertion 92 coincides with the end of $t_{int1}$ and the beginning of $t_{int2}$. Immediately after assertion 92, the charge at FD1 corresponds to the amount of charge accumulated in photodiode 20 during $t_{int1}$. This value may be sampled by asserting sample transistor SAMP at assertion 94. Because RST2, S1, S3, and S4 are all turned off during assertions 94 and 96, the charge from FD1 will be stored in C2 when SAMP and S2 are asserted.

After storing the $t_{int1}$ sample in storage capacitor C2, reset transistor RST2 may be asserted at assertion 98 and S3 may be asserted at assertion 104. Next, the transfer transistor (TX) may be turned on at assertion 100. This will transfer charge from photodiode 20 to FD1. The end of assertion 100 coincides with the end of $t_{int2}$ and the beginning of $t_{int3}$. Immediately after assertion 100, the charge at FD1 corresponds to the amount of charge accumulated in photodiode 20 during $t_{int2}$. This value may be sampled by asserting sample transistor SAMP at assertion 102. Because RST2, S1, S2, and S4 are all turned off during assertions 102 and 104, the charge from FD1 will be stored in C3 when SAMP and S3 are asserted.

After storing the $t_{int2}$ sample in storage capacitor C3, reset transistor RST2 may be asserted at assertion 106 and S4 may be asserted at assertion 112. Next, the transfer transistor (TX) may be turned on at assertion 108. This will transfer charge from photodiode 20 to FD1. The end of assertion 108 coincides with the end of $t_{int3}$. Immediately after assertion 108, the charge at FD1 corresponds to the amount of charge accumulated in photodiode 20 during $t_{int3}$. This value may be sampled by asserting sample transistor SAMP and transistor S4 at assertion 110. Because RST2, S1, S2, and S3 are all turned off during assertions 110 and 112, the charge from FD1 will be stored in C4 when SAMP and S4 are asserted.

After storing the $t_{int3}$ sample in storage capacitor C4, each storage capacitor may have a corresponding sample. C1 may have the reset value stored, C2 may have the $t_{int1}$ sample stored, C3 may have the $t_{int2}$ sample stored, and C4 may have the $t_{int3}$ stored. The sampling of pixel 30 may be completed globally, meaning every pixel in image sensor 16 may simultaneously follow the timing diagram in FIG. 3. In the example of FIG. 3, $t_{int1}$ is shown as being longer than $t_{int2}$ and $t_{int3}$, while $t_{int2}$ is shown as being longer than $t_{int3}$. However, this example is merely illustrative.

Figure 4:
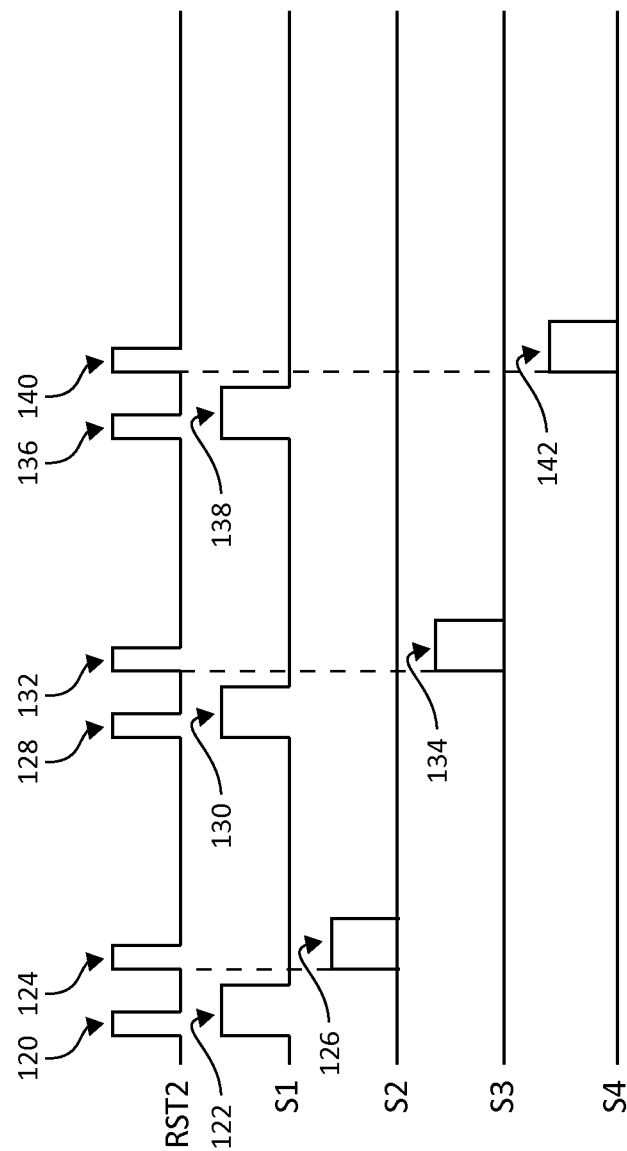
FIG. 4 is an illustrative timing diagram for reading out image samples with a pixel such as the pixel in FIG. 2 in accordance with an embodiment of the present invention.

FIG. 4 is a timing diagram of pixel 30 during sample read out. This portion of the pixel operation may not be completed globally. For example, the samples of each row of pixels may be read sequentially as opposed to simultaneously. As shown in FIG. 4, reset transistor RST2 may be asserted at assertion 120 to reset FD2. S1 may also be asserted at assertion 122 to read out the charge stored in storage capacitor C1. FD2 may be reset again at assertion 124. S2 may also be turned on at assertion 126 to read out the charge stored in storage capacitor C2.

After reading out the charges stored in storage capacitor C1 and C2, FD2 may be reset at assertion 128. S1 may also be asserted at assertion 130 to read out the charge stored in storage capacitor C1. FD2 may be reset again at assertion 132. S3 may also be turned on at assertion 134 to read out the charge stored in storage capacitor C3.

After reading out the charges stored in storage capacitor C1 and C3, FD2 may be reset at assertion 136. S1 may also be asserted at assertion 138 to read out the charge stored in storage capacitor C1. FD2 may be reset again at assertion 140. S4 may also be turned on at assertion 142 to read out the charge stored in storage capacitor C4.

Sampling C1 at assertions 130 and 138 may help eliminate noise associated with the reset value of capacitors C1, C2, C3, and C4. Before assertion 122, C1 may store charge associated with the reset level of FD1 (as described in connection with FIG. 3). Sampling C1 at assertion 122 enables use of a correlated double sampling (CDS) technique to account for reset noise at FD1. After C1 is sampled at assertion 122, the reset level of FD1 is no longer available for sampling. However, there may also be noise associated with the reset of capacitors C1, C2, C3, and C4 and FD2. Although sampling C1 at assertions 130 and 138 will not account for FD1 reset noise, the sampling may help account for the noise associated with RST2. However, these samplings may be omitted if desired (e.g., assertions 128, 130, 136, and 138 may be omitted during read out).

In the example of FIG. 2, four storage capacitors are depicted. However, this example is merely illustrative. If desired, pixel 30 may have one storage capacitor, two storage capacitors, three storage capacitors, four storage capacitors, five storage capacitors, six storage capacitors, seven storage capacitors, eight storage capacitors, or more than eight storage capacitors.

In certain embodiments, only the first sample (from the first integration time) may be corrected for reset noise of the first floating diffusion region. In these embodiments, the longest integration time may be completed first. The longest integration time may be associated with low light levels and thus may be the most sensitive to reset noise. By making the longest integration time the first integration time, the most sensitive sample is corrected. The subsequent samples may be less sensitive to reset noise, and not accounting for the reset noise may not substantially affect the image quality.

The relative lengths of the integration times of FIG. 3 are purely illustrative. If desired, the first integration time may be the shortest integration time, the longest integration time, or an intermediate integration time. In general, each integration time may have any desired length, and the integration times may be arranged in any desired order. Additionally, sampling the reset level for only the first integration period is merely illustrative. If desired, a pixel with four capacitors may sample two reset values and two sample values (e.g., two different integration periods and their respective reset values may be sampled).

In general, one storage capacitor is required for sampling an integration time without accounting for FD1 reset noise (non-CDS samples), while two storage capacitors are required for sampling an integration time and accounting for reset noise (CDS samples). Any combination of these samples may be used, limited only by how many capacitors are present in the pixel. For example, if pixel 30 includes four capacitors, the image sensor may be used to obtain four non-CDS samples, one CDS sample and two non-CDS samples (e.g., FIG. 3), or two CDS samples. Pixel 30 may include two capacitors. In these embodiments, pixel 30 may be used to obtain one CDS sample or two non-CDS samples. Pixel 30 may include three storage capacitors. In these embodiments, pixel 30 may be used to obtain three non-CDS samples or one CDS sample and one non-CDS sample. At least two samples are required for a high dynamic range (HDR) image. More samples may increase the dynamic range of the image. By requiring two storage capacitors, CDS samples may limit how many samples can be acquired by a given pixel (possibly reducing dynamic range), but will result in a less noisy image. The specific scene to be imaged or the preferences of the user of the imaging system may dictate what sampling scheme is used.

Figure 5:
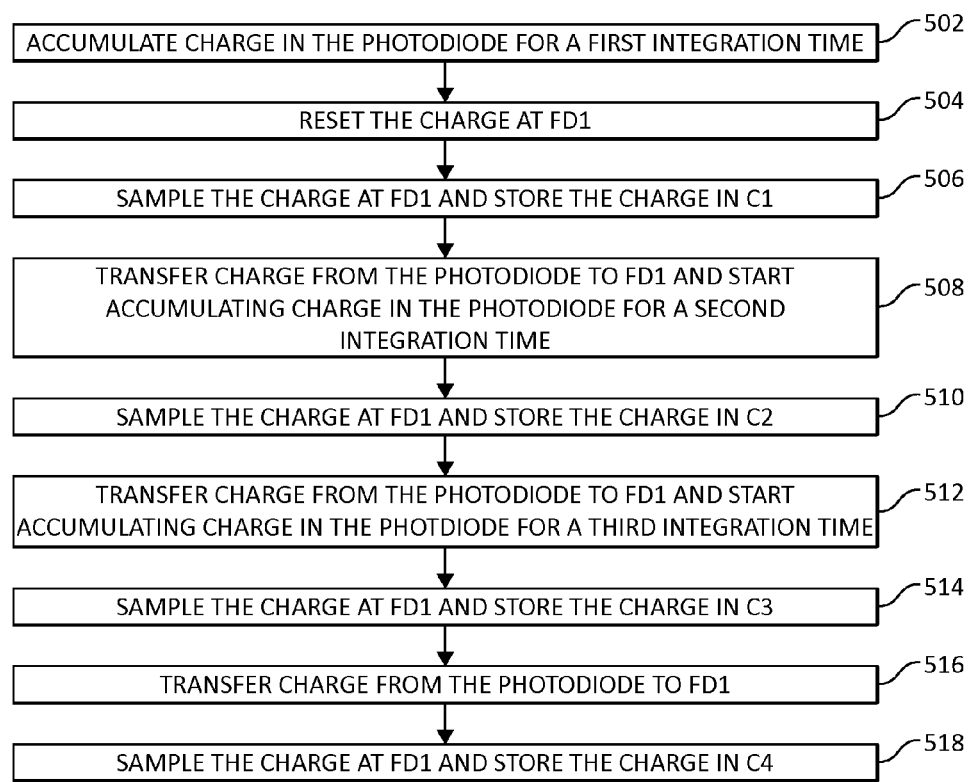
FIG. 5 is a flowchart of illustrative steps that may be used to operate a pixel with storage capacitors to obtain CDS and non-CDS samples in accordance with an embodiment of the present invention.
Figure 6:
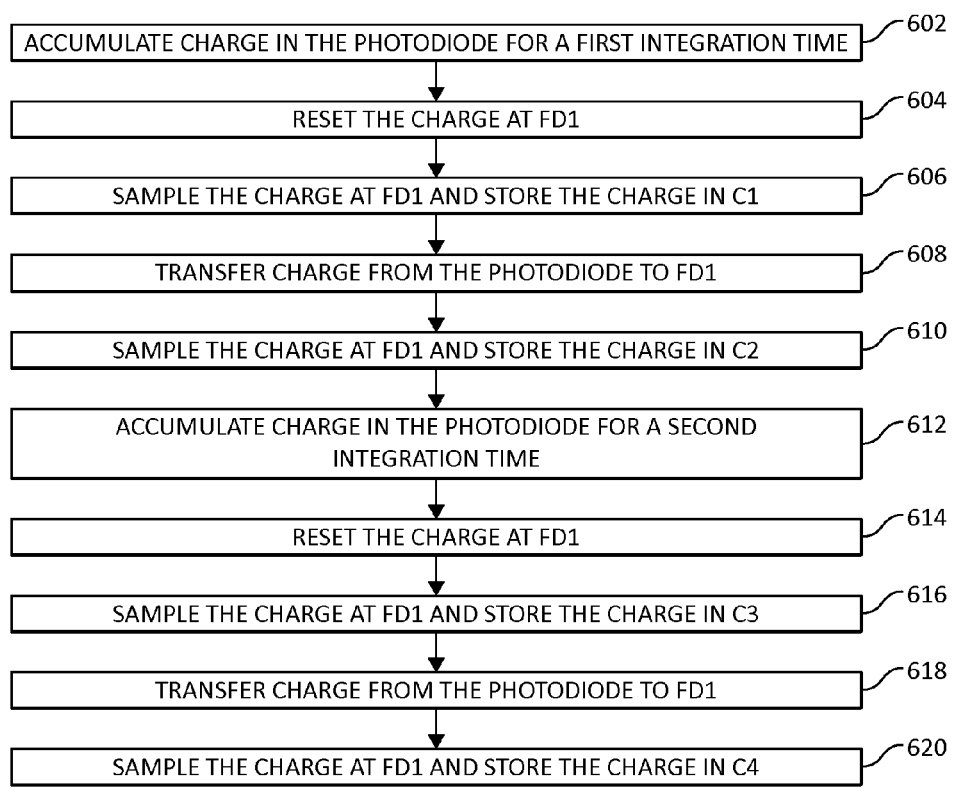
FIG. 6 is a flowchart of illustrative steps that may be used to operate a pixel with storage capacitors to obtain multiple CDS samples in accordance with an embodiment of the present invention.

Illustrative methods of operating an image pixel such as image pixel 30 from FIG. 2 are shown in FIGS. 5 and 6. In FIG. 5, a flowchart shows steps for collecting one CDS sample and two non-CDS samples in storage capacitors. At step 502 in FIG. 5, the photodiode may begin accumulating charge for a first integration time (e.g., $t_{int1}$). At step 504, FD1 may be reset (e.g., using reset transistor 26). After resetting the charge at FD1, the charge at FD1 may be sampled and the charge stored in storage capacitor C1 at step 506. At step 508, charge may be transferred from the photodiode to FD1. Charge may also start accumulating for a second integration time (e.g., $t_{int2}$). At step 510, the charge at FD1 (which accumulated in the photodiode during $t_{int1}$) may be sampled and the charge stored in capacitor C2. At step 512, charge may be transferred from the photodiode to FD1. Charge may also start accumulating for a third integration time (e.g., $t_{int3}$). At step 514, the charge at FD1 (which accumulated in the photodiode during $t_{int2}$) may be sampled and the charge stored in capacitor C3. At step 516, charge may be transferred from the photodiode to FD1. At step 518, the charge at FD1 (which accumulated in the photodiode during $t_{int3}$) may be sampled and the charge stored in capacitor C4. This method enables the collection of one CDS sample (in capacitors C1 and C2) and two non-CDS samples (in capacitors C3 and C4, respectively).

In FIG. 6, a flowchart shows steps for collecting two CDS samples in storage capacitors. At step 602 in FIG. 6, the photodiode may begin accumulating charge for a first integration time (e.g., $t_{int1}$). At step 604, FD1 may be reset (e.g., using reset transistor 26). After resetting the charge at FD1, the charge at FD1 may be sampled and the charge stored in storage capacitor C1 at step 606. At step 608, charge may be transferred from the photodiode to FD1. At step 610, the charge at FD1 may be sampled and the charge stored in storage capacitor C2. At step 612, charge may start accumulating for a second integration time (e.g., $t_{int2}$). At step 614, FD1 may be reset (e.g., using reset transistor 26). After resetting the charge at FD1, the charge at FD1 may be sampled and the charge stored in storage capacitor C3 at step 616. At step 618, charge may be transferred from the photodiode to FD1. At step 620, the charge at FD1 may be sampled and the charge stored in storage capacitor C4. This method enables the collection of two CDS samples, one that is stored in C1 and C2, and another that is stored in C3 and C4.

Photodiode 20 may be formed in a substrate. The substrate may be a wafer, which is a layer of semiconductor material such as silicon. The substrate may be crystalline silicon or another desired material. Photodiode 20 may be formed from n-type doped silicon. The substrate surrounding photodiode 20 may be p-type doped silicon. In certain embodiments, the photodiode may be formed from p-type doped silicon and be surrounded by n-type doped silicon.

Photodiode 20 may be covered by a passivation layer, a color filter layer, a planarization layer, and a microlens. The passivation layer and planarization layer may be formed from dielectric materials. The color filter layer may be a part of a larger color filter array. For example, each pixel in image sensor 14 may have an individual color filter layer that is part of the color filter array. Image sensor 14 may include a Bayer color filter array in which vertically and horizontally adjacent color filters in the array are of different colors. The Bayer color filter array includes red, green, and blue color filters. A single red, green, blue, cyan, magenta, yellow, near-infrared, infrared, or clear color filter may be formed over photodiode 20. In certain embodiments, the color filter formed over photodiode 20 may have areas that pass colored light and areas that are clear (i.e., that pass visible spectrum light). A microlens may be formed over each pixel in image sensor 14. Each microlens may direct light towards a respective photodiode.

The pixel circuitry in the pixel of FIG. 2 may all be formed in a single substrate (e.g., a single wafer). However, the storage capacitors C1, C2, C3, and C4 may take up space in the substrate and limit the amount of space available for photodiode 20. Therefore, in certain embodiments, two substrates may be used to form the pixel circuitry of pixels such as pixel 30. The substrate layers may be silicon wafers or another desired semiconductor material.

Figure 7:
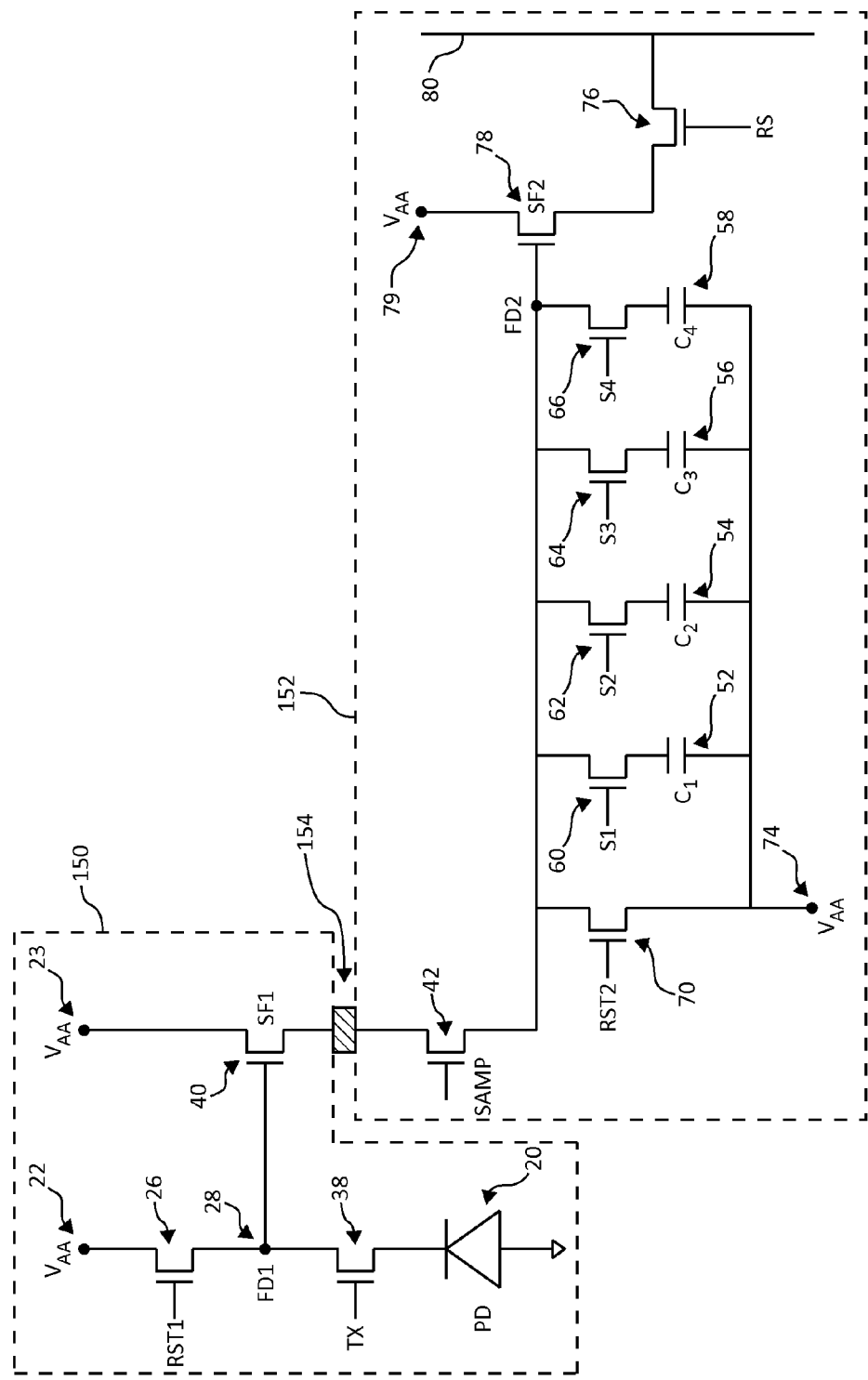
FIG. 7 is a diagram of an illustrative image pixel with multiple substrate layers that shows how an interconnect layer can be interposed between a source follower transistor and a sampling transistor in accordance with an embodiment of the present invention.

As shown in FIG. 7, an upper substrate layer 150 in pixel 30 may be connected to a lower substrate layer 152. Upper and lower substrate layers 150 and 152 may be crystalline silicon or any other desired material. An interconnect layer may be used to connect upper substrate layer 150 to lower substrate layer 152. Interconnect layer 154 may be formed from a conductive material such as metal (e.g., copper). In certain embodiments, the interconnect layer may include solder. The interconnect layer may also be a through silicon via (TSV).

As shown in FIG. 7, interconnect layer 154 may couple source follower transistor 40 (SF1) to sampling transistor 42 (SAMP). Interconnect layer 154 may be coupled directly to SF1 and SAMP without any intervening transistors. The interconnect layer may enable photodiode 20 to have a larger size than if all of the pixel circuitry was in a single wafer. Another advantage of interconnect layer 154 is that it may act as a reflector for photodiode 20. As photons pass through photodiode 36, some of the photons may be absorbed by the photodiode and converted to charge. However, some photons may pass through the photodiode without being converted to charge. These photons may reflect off of interconnect layer 154 and travel upwards towards the photodiode. This increases the probability that the photon will be converted to charge by the photodiode.

Figure 8:
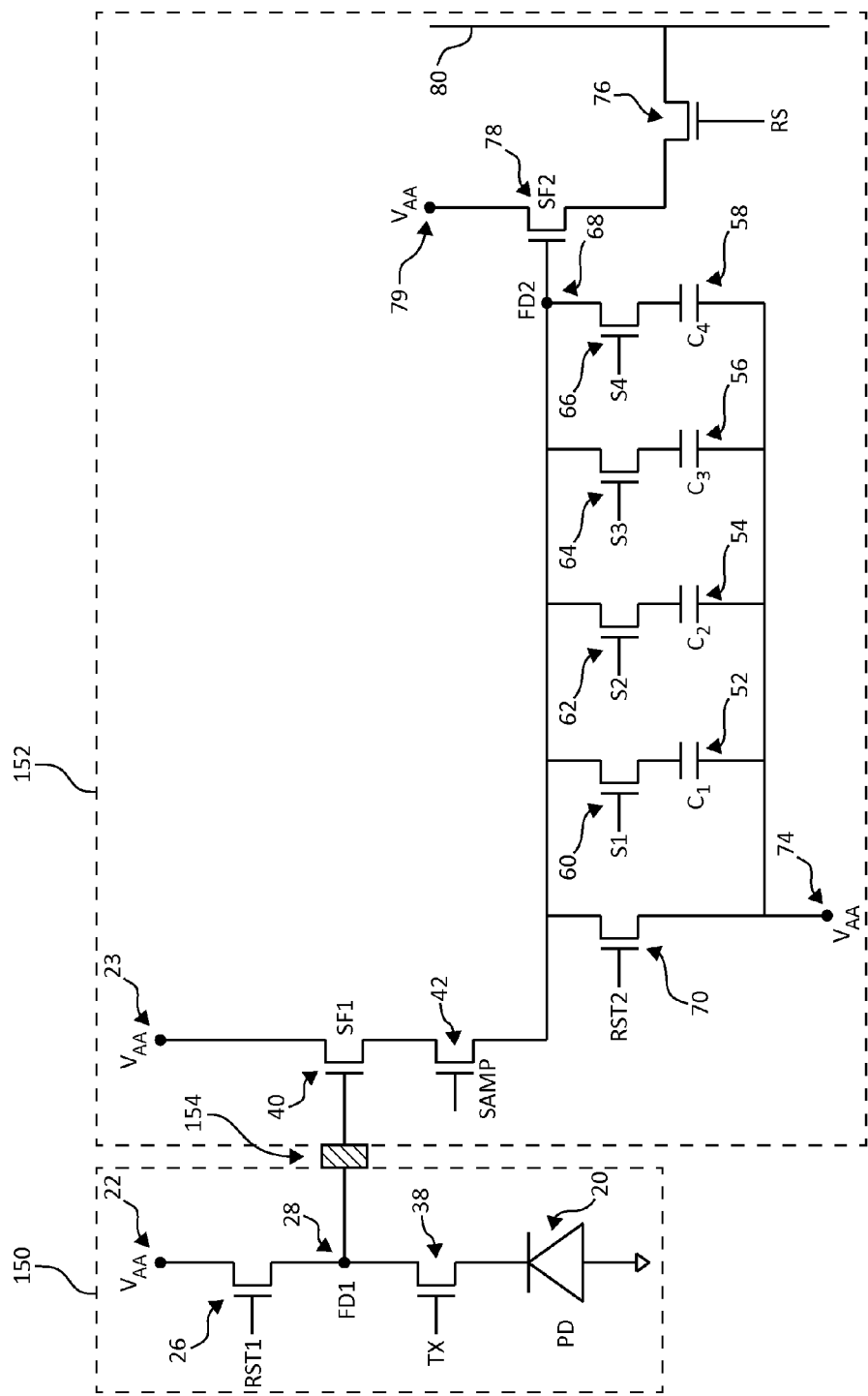
FIG. 8 is a diagram of an illustrative image pixel with multiple substrate layers that shows how an interconnect layer can be interposed between a source follower transistor and a floating diffusion region in accordance with an embodiment of the present invention.
Figure 9:
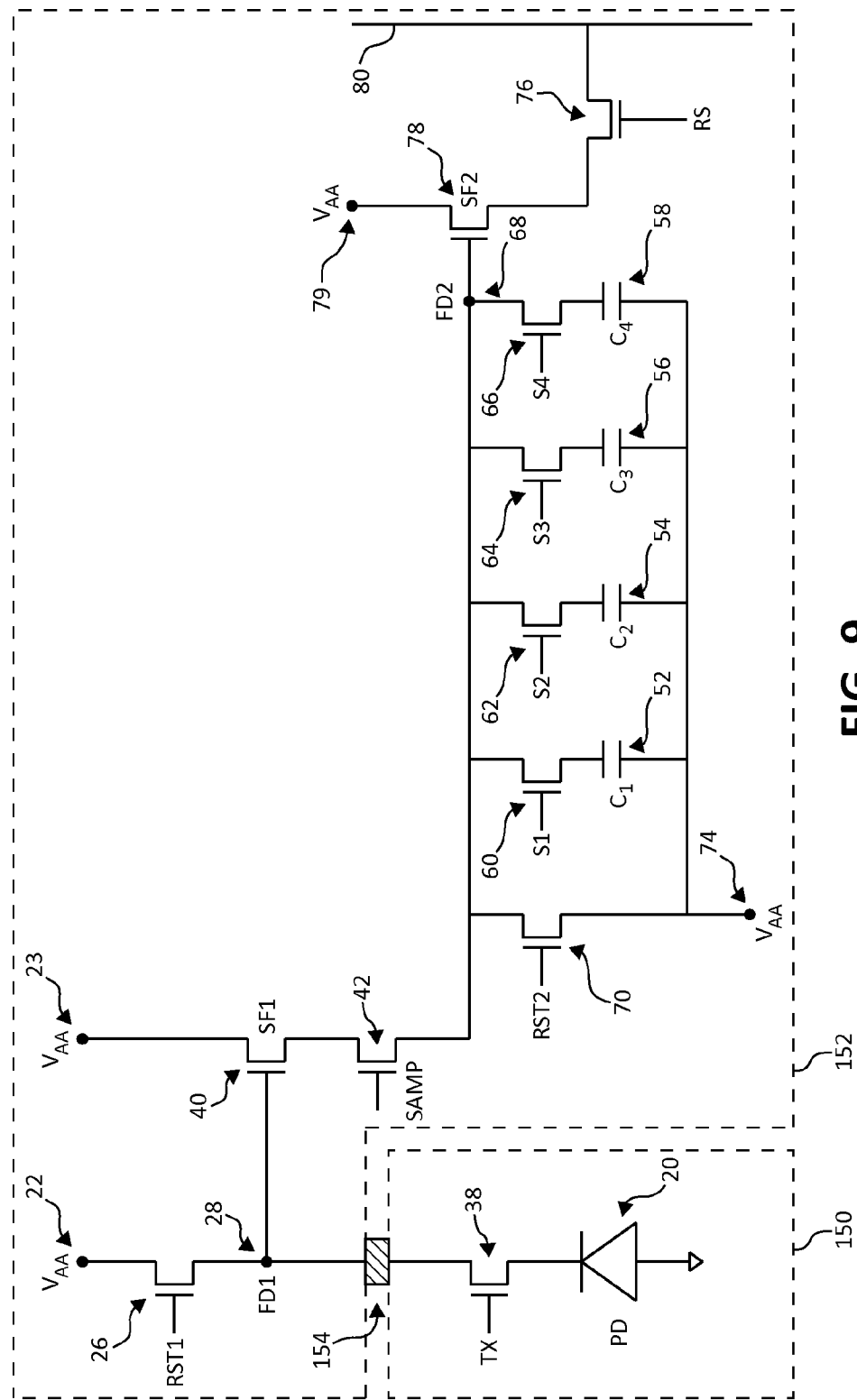
FIG. 9 is a diagram of an illustrative image pixel with multiple substrate layers that shows how an interconnect layer can be interposed between a transfer transistor and a floating diffusion region in accordance with an embodiment of the present invention.

Interconnect layer 154 does not necessarily have to be positioned between transistors 40 and 42. For example, as shown in FIG. 8 the interconnect layer may be positioned between FD1 and SF1. Interconnect layer 154 may be coupled directly to SF1 and FD1 without any intervening transistors. In yet another embodiment, interconnect layer 154 may be positioned between FD1 and transfer transistor 38 (TX), as shown in FIG. 9. Interconnect layer 154 may be coupled directly to TX and FD1 without any intervening transistors.

In various embodiments of the invention, an imaging pixel may include an upper substrate layer, a lower substrate layer, a floating diffusion region, a photodiode in the upper substrate layer that is coupled to the floating diffusion region, an interconnect layer interposed between the upper substrate layer and the lower substrate layer that couples the upper substrate layer to the lower substrate layer, and a first storage capacitor in the lower substrate layer.

The imaging pixel may also include a source follower transistor coupled to the floating diffusion region, an additional floating diffusion region, an additional source follower transistor coupled to the additional floating diffusion region, and a sampling transistor coupled between the source follower transistor and the additional floating diffusion region. The interconnect layer may be interposed between the source follower transistor and the sampling transistor. The floating diffusion region and the source follower transistor may be formed in the upper substrate layer, and the sampling transistor, the additional floating diffusion region, and the additional source follower transistor may be formed in the lower substrate layer. The imaging pixel may also include second and third storage capacitors formed in the lower substrate layer.

In other embodiments, the imaging pixel may include a source follower transistor formed in the lower substrate layer that is coupled to the floating diffusion region. The floating diffusion region may be formed in the upper substrate layer, and the interconnect layer may be interposed between the floating diffusion region and the source follower transistor. The imaging pixel may also include second and third storage capacitors formed in the lower substrate layer.

In yet another embodiment, the imaging pixel may include a transfer transistor formed in the upper substrate layer that is coupled to the floating diffusion region. The floating diffusion region may be formed in the lower substrate layer and the interconnect layer may be interposed between the transfer transistor and the floating diffusion region. The imaging pixel may also include second and third storage capacitors formed in the lower substrate layer.

In various embodiments of the invention, an imaging pixel may include a first floating diffusion region, a photodiode coupled to the first floating diffusion region, a first source follower transistor coupled to the first floating diffusion region, a second floating diffusion region, a second source follower transistor coupled to the second floating diffusion region, a first storage capacitor, a second storage capacitor, and a third storage capacitor.

The imaging pixel may also include a sampling transistor interposed between the second floating diffusion region and the first source follower transistor. The imaging pixel may also include a first reset transistor interposed between the first floating diffusion region and a first positive power supply terminal and a second reset transistor interposed between the second floating diffusion region and a second positive power supply terminal. The imaging pixel may also include a transistor interposed between the sampling transistor and the first storage capacitor, a transistor interposed between the sampling transistor and the second storage capacitor, and a transistor interposed between the sampling transistor and the third storage capacitor. The imaging pixel may also include a row select transistor interposed between an output line and the second source follower transistor.

In various embodiments of the invention, a method of operating an imaging pixel may be provided. The imaging pixel may include a photodiode, a floating diffusion region, a first storage capacitor, a second storage capacitor, and a third storage capacitor. The method may include accumulating a first amount of charge for a first time period with the photodiode, resetting the floating diffusion region to a power supply voltage, sampling a second amount of charge at the floating diffusion region and storing the second amount of charge in the first storage capacitor after resetting the floating diffusion region to the power supply voltage, transferring the first amount of charge to the floating diffusion region, sampling the first amount of charge at the floating diffusion region and storing the first amount of charge in the second storage capacitor after transferring the first amount of charge to the floating diffusion region, accumulating a third amount of charge for a second time period with the photodiode, transferring the third amount of charge to the floating diffusion region, and sampling the third amount of charge at the floating diffusion region and storing the third amount of charge in the third storage capacitor after transferring the third amount of charge to the floating diffusion region.

In certain embodiments, the imaging pixel may also include a fourth storage capacitor. The method may also include accumulating a fourth amount of charge for a third time period with the photodiode, transferring the fourth amount of charge to the floating diffusion region, and sampling the fourth amount of charge at the floating diffusion region and storing the fourth amount of charge in the fourth storage capacitor after transferring the fourth amount of charge to the floating diffusion region. The method may also include resetting the floating diffusion region to the power supply voltage before transferring the third amount of charge to the floating diffusion region and after sampling the second amount of charge at the floating diffusion region, and sampling a fourth amount of charge at the floating diffusion region and storing the fourth amount of charge in the fourth storage capacitor after resetting the floating diffusion region to the power supply voltage and before transferring the third amount of charge to the floating diffusion region.

The first time period may be longer than the second time period. The imaging pixel may also include a first source follower transistor coupled to the floating diffusion region, an additional floating diffusion region, and a second source follower transistor coupled to the additional floating diffusion region. The imaging pixel may also include a transistor interposed between the first source follower transistor and the additional floating diffusion region, and sampling the first amount of charge at the floating diffusion region and storing the first amount of charge in the second storage capacitor may include turning on the transistor.

The foregoing is merely illustrative of the principles of this invention and various modifications can be made by those skilled in the art without departing from the scope and spirit of the invention.

What is claimed is:

1. An imaging pixel comprising:
   an upper substrate layer;
   a lower substrate layer;
   a floating diffusion region;
   a photodiode in the upper substrate layer that is coupled to the floating diffusion region;
   an interconnect layer interposed between the upper substrate layer and the lower substrate layer that couples the upper substrate layer to the lower substrate layer;
   a first storage capacitor in the lower substrate layer;
   a source follower transistor coupled to the floating diffusion region;
   an additional floating diffusion region;
   an additional source follower transistor coupled to the additional floating diffusion region; and
   a sampling transistor coupled between the source follower transistor and the additional floating diffusion region, wherein the floating diffusion region and the source follower transistor are formed in the upper substrate layer, and wherein the additional floating diffusion region and the additional source follower transistor are formed in the lower substrate layer.

2. The imaging pixel defined in claim 1, wherein the interconnect layer is interposed between the source follower transistor and the sampling transistor.

3. The imaging pixel defined in claim 2, wherein the sampling transistor is formed in the lower substrate layer.

4. The imaging pixel defined in claim 3, further comprising:
   second and third storage capacitors formed in the lower substrate layer.

5. An imaging pixel comprising:
   an upper substrate layer;
   a lower substrate layer;
   a floating diffusion region;
   a photodiode in the upper substrate layer that is coupled to the floating diffusion region;
   an interconnect layer interposed between the upper substrate layer and the lower substrate layer that couples the upper substrate layer to the lower substrate layer;
   a first storage capacitor in the lower substrate layer; and
   a transfer transistor formed in the upper substrate layer that is coupled to the floating diffusion region, wherein the floating diffusion region is formed in the lower substrate layer, and wherein the interconnect layer is interposed between the transfer transistor and the floating diffusion region.

6. The imaging pixel defined in claim 5, further comprising:
   second and third storage capacitors formed in the lower substrate layer.

7. An imaging pixel comprising:
   a first floating diffusion region;
   a photodiode coupled to the first floating diffusion region;
   a first source follower transistor coupled to the first floating diffusion region;
   a second floating diffusion region;
   a second source follower transistor coupled to the second floating diffusion region;
   a first storage capacitor;
   a second storage capacitor;
   a third storage capacitor;
   a sampling transistor interposed between the second floating diffusion region and the first source follower transistor;
   a transistor interposed between the sampling transistor and the first storage capacitor;
   a transistor interposed between the sampling transistor and the second storage capacitor; and
   a transistor interposed between the sampling transistor and the third storage capacitor.

8. The imaging pixel defined in claim 7, further comprising:
   a first reset transistor interposed between the first floating diffusion region and a first positive power supply terminal; and
   a second reset transistor interposed between the second floating diffusion region and a second positive power supply terminal.

9. The imaging pixel defined in claim 8, further comprising a row select transistor interposed between an output line and the second source follower transistor.

10. A method of operating an imaging pixel, wherein the imaging pixel comprises a photodiode, a floating diffusion region, a first storage capacitor, a second storage capacitor, and a third storage capacitor, the method comprising:
    with the photodiode, accumulating a first amount of charge for a first time period;
    resetting the floating diffusion region to a power supply voltage;
    after resetting the floating diffusion region to the power supply voltage, sampling a second amount of charge at the floating diffusion region and storing the second amount of charge in the first storage capacitor;
    transferring the first amount of charge to the floating diffusion region;
    after transferring the first amount of charge to the floating diffusion region, sampling the first amount of charge at the floating diffusion region and storing the first amount of charge in the second storage capacitor;
    with the photodiode, accumulating a third amount of charge for a second time period;
    transferring the third amount of charge to the floating diffusion region; and
    after transferring the third amount of charge to the floating diffusion region, sampling the third amount of charge at the floating diffusion region and storing the third amount of charge in the third storage capacitor.

11. The method defined in claim 10, wherein the imaging pixel further comprises a fourth storage capacitor, the method further comprising:
    with the photodiode, accumulating a fourth amount of charge for a third time period;
    transferring the fourth amount of charge to the floating diffusion region; and
    after transferring the fourth amount of charge to the floating diffusion region, sampling the fourth amount of charge at the floating diffusion region and storing the fourth amount of charge in the fourth storage capacitor.

12. The method defined in claim 10, wherein the imaging pixel further comprises a fourth storage capacitor, the method further comprising:
    before transferring the third amount of charge to the floating diffusion region and after sampling the second amount of charge at the floating diffusion region, resetting the floating diffusion region to the power supply voltage; and
    after resetting the floating diffusion region to the power supply voltage and before transferring the third amount of charge to the floating diffusion region, sampling a fourth amount of charge at the floating diffusion region and storing the fourth amount of charge in the fourth storage capacitor.

13. The method defined in claim 10, wherein the first time period is longer than the second time period.

14. The method defined in claim 10, wherein the imaging pixel further comprises a first source follower transistor coupled to the floating diffusion region, an additional floating diffusion region, and a second source follower transistor coupled to the additional floating diffusion region.

15. The method defined in claim 14, wherein the imaging pixel further comprises a transistor interposed between the first source follower transistor and the additional floating diffusion region, and wherein sampling the first amount of charge at the floating diffusion region and storing the first amount of charge in the second storage capacitor comprises turning on the transistor.

* * * * *